(12) United States Patent
Halliyal et al.

(10) Patent No.: US 6,674,138 B1
(45) Date of Patent: Jan. 6, 2004

(54) USE OF HIGH-K DIELECTRIC MATERIALS IN MODIFIED ONO STRUCTURE FOR SEMICONDUCTOR DEVICES

(75) Inventors: Arvind Halliyal, Cupertino, CA (US); Mark T. Ramsbey, Sunnyvale, CA (US); Kuo-Tung Chang, Saratoga, CA (US); Nicholas H. Tripsas, San Jose, CA (US); Robert B. Ogle, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 29 days.

(21) Appl. No.: 10/036,757

(22) Filed: Dec. 31, 2001

(51) Int. Cl.[7] .............................................. H01L 29/76
(52) U.S. Cl. ........................ 257/411; 257/314; 257/315; 257/316; 257/322
(58) Field of Search ................................. 257/314, 315, 257/316, 322, 411

(56) References Cited

U.S. PATENT DOCUMENTS

| | | | |
|---|---|---|---|
| 5,120,672 A | * 6/1992 | Mitchell et al. | ............... 437/43 |
| 6,008,091 A | * 12/1999 | Gregor et al. | ............... 438/261 |
| 6,171,900 B1 | * 1/2001 | Sun | ............... 438/240 |
| 6,248,628 B1 | 6/2001 | Halliyal et al. | ............... 438/257 |
| 6,309,927 B1 | 10/2001 | Au et al. | ............... 438/261 |
| 6,319,775 B1 | 11/2001 | Halliyal et al. | ............... 438/261 |
| 2002/0106536 A1 | * 8/2002 | Lee et al. | ............... 428/702 |
| 2002/0115252 A1 | * 8/2002 | Haukka et al. | ............... 438/240 |

* cited by examiner

Primary Examiner—Richard Elms
Assistant Examiner—Christian D. Wilson
(74) Attorney, Agent, or Firm—Renner, Otto, Boisselle & Sklar, LLP

(57) ABSTRACT

A process for fabrication of a semiconductor device including a modified ONO structure, including forming the modified ONO structure by providing a semiconductor substrate; forming a first oxide layer on the semiconductor substrate; depositing a layer comprising a high-K dielectric material on the first oxide layer; and forming a top oxide layer on the layer comprising a high-K dielectric material. The semiconductor device may be, e.g., a MIRRORBIT™ two-bit EEPROM device or a floating gate flash device including a modified ONO structure.

16 Claims, 4 Drawing Sheets

USE OF HIGH-K DIELECTRIC MATERIALS IN MODIFIED ONO STRUCTURE FOR SEMICONDUCTOR DEVICES

TECHNICAL FIELD

The present invention relates to a process for preparation of a semiconductor device including forming a modified ONO structure. The modified ONO structure comprises a high-K dielectric material.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in EEPROM device technology have focused on increasing the programming speed, lowering programming and reading voltages, increasing data retention time, reducing cell erasure times and reducing cell dimensions. One important dielectric material for the fabrication of the EEPROM is an oxide-nitride-oxide (ONO) structure. One EEPROM device that utilizes the ONO structure is a silicon-oxide-nitride-oxide-silicon (SONOS) type cell. A second EEPROM device that utilizes the ONO structure is a floating gate flash memory device, in which the ONO structure is formed over the floating gate, typically a polysilicon floating gate.

In SONOS devices, during programming, electrical charge is transferred from the substrate to the silicon nitride layer in the ONO structure. Voltages are applied to the gate and drain creating vertical and lateral electric fields, which accelerate the electrons along the length of the channel. As the electrons move along the channel, some of the electrons gain sufficient energy to jump over the potential barrier of the bottom silicon dioxide layer and become trapped in the silicon nitride layer. Electrons are trapped near the drain region because the electric fields are the strongest near the drain. Reversing the potentials applied to the source and drain will cause electrons to travel along the channel in the opposite direction and be injected into the silicon nitride layer near the source region. Because silicon nitride is not electrically conductive, the charge introduced into the silicon nitride layer tends to remain localized. Accordingly, depending upon the application of voltage potentials, electrical charge can be stored in discrete regions within a single continuous silicon nitride layer.

Non-volatile memory designers have taken advantage of the localized nature of electron storage within a silicon nitride layer and have designed memory circuits that utilize two regions of stored charge within an ONO layer. This type of non-volatile memory device is known as a two-bit EEPROM, which is available under the trademark MIRRORBIT™ from Advanced Micro Devices, Inc., Sunnyvale, Calif. The MIRRORBIT™ two-bit EEPROM is capable of storing twice as much information as a conventional EEPROM in a memory array of equal size. A left and right bit is stored in physically different areas of the silicon nitride layer, near left and right regions of each memory cell. Programming methods are then used that enable two bits to be programmed and read simultaneously. The two-bits of the memory cell can be individually erased by applying suitable erase voltages to the gate and to either the source or drain regions.

As device dimensions continue to be reduced, the electrical thickness of the ONO layer must be reduced accordingly. Previously, this has been accomplished by scaling down the thickness of the ONO layer. However, as the ONO layer is made physically thinner, leakage currents through the ONO layer may increase, and the charge trapping ability of the nitride layer may be reduced, which limits the scaling down of the total physical thickness of the ONO layer.

A floating gate flash device includes a floating gate electrode upon which electrical charge is stored. The floating gate electrode is formed on a tunnel oxide layer which overlies a channel region residing between the source and drain regions in a semiconductor substrate. The floating gate electrode together with the source and drain regions form an enhancement transistor. Typically, the floating gate electrode may be formed of polysilicon.

In a floating gate flash device, electrons are transferred to a floating gate electrode through a dielectric layer overlying the channel region of the enhancement transistor. The electron transfer is initiated by either hot electron injection, or by Fowler-Nordheim tunneling. In either electron transfer mechanism, a voltage potential is applied to the floating gate electrode by an overlying control gate electrode. The control gate electrode is capacitively coupled to the floating gate electrode, such that a voltage applied on the control gate electrode is coupled to the floating gate electrode. The floating gate flash device is programmed by applying a high positive voltage to the control gate electrode, and a lower positive voltage to the drain region, which transfers electrons from the channel region to the floating gate electrode.

The control gate electrode is separated from the floating gate electrode by an interpoly dielectric layer, typically an oxide-nitride-oxide stack, i.e., an ONO structure or layer. However, as device dimensions continue to be reduced, the electrical thickness of the interpoly dielectric layer between the control gate electrode and the floating gate electrode must be reduced accordingly. Previously, this has been accomplished by scaling down the physical thickness of the ONO layer. However, as the ONO layer is made physically thinner, leakage current through the ONO layer may increase, which limits the scaling down of the total physical thickness of the ONO layer.

Some of the improvements in devices can be addressed through development of materials and processes for fabricating the ONO layer. Recently, development efforts have focused on novel processes and materials for use in fabrication of the ONO layer. While the recent advances in EEPROM technology have enabled memory designers to double the memory capacity of EEPROM arrays using two-bit data storage, numerous challenges exist in the fabrication of material layers within these devices. In particular, the ONO layer must be carefully fabricated to avoid an increase in the leakage current. Accordingly, advances in ONO fabrication technology are needed to insure proper charge isolation in ONO structures used in MIRRORBIT™ two-bit EEPROM devices and in floating gate flash devices.

DISCLOSURE OF INVENTION

In one embodiment, the present invention relates to a semiconductor device including a modified ONO structure, in which the modified ONO structure includes a bottom oxide layer, a layer including a composite dielectric material on the bottom oxide layer, in which the composite dielectric material includes elements of at least one high-K dielectric material, and a top oxide layer on the layer including a high-K dielectric material.

In one embodiment, the present invention relates to a non-volatile memory cell including a) a substrate including a source region, a drain region, and a channel region positioned therebetween; b) a floating gate positioned above the channel region and separated from the channel region by a tunnel dielectric film; and c) a control gate positioned above the floating gate and separated from the floating gate by an interpoly dielectric layer, the interpoly dielectric layer including a bottom silicon dioxide layer adjacent to the floating gate, a top silicon dioxide layer adjacent to the control gate, and a center layer including a high-K dielectric material and positioned between the bottom silicon dioxide layer and the top silicon dioxide layer.

In another embodiment, the present invention relates to a non-volatile memory cell including a) a substrate including a source region, a drain region, and a channel region positioned therebetween; b) a charge storage layer including a modified ONO structure, having a bottom silicon dioxide layer adjacent the channel region, a top silicon dioxide layer, and a center charge storage layer including a high-K dielectric material layer and positioned between the bottom silicon oxide layer and the top silicon dioxide layer; and c) a gate capacitively coupled to the channel region through the charge storage layer.

In one embodiment, the present invention relates to a process for fabrication of a semiconductor device including a non-volatile memory cell having a modified ONO structure, including forming the modified ONO structure by steps comprising providing a semiconductor substrate; forming a first oxide layer on the semiconductor substrate; depositing a high-K dielectric material layer on the first oxide layer; and forming a top oxide layer on the high-K dielectric material layer.

In another embodiment, the present invention relates to a process for fabrication of a two-bit EEPROM device including a modified ONO structure, including forming the modified ONO structure by steps including providing a semiconductor substrate; forming a first or tunnel oxide layer overlying the semiconductor substrate; depositing a high-K dielectric material layer overlying the tunnel oxide layer; and forming a top oxide layer overlying the high-K dielectric material layer.

In yet another embodiment, the present invention relates to a process for fabrication of a floating gate flash device including a modified ONO structure, including forming the modified ONO structure by steps comprising providing a semiconductor substrate having a floating gate electrode; forming a first or bottom oxide layer overlying the floating gate electrode; depositing a high-K dielectric material layer overlying the bottom oxide layer; and forming a top oxide layer overlying the high-K dielectric material layer.

In one embodiment, the present invention relates to a non-volatile memory cell including a) a substrate comprising a source region, a drain region, and a channel region positioned therebetween; b) a floating gate positioned above the channel region and separated from the channel region by a tunnel dielectric film; and c) a control gate positioned above the floating gate and separated from the floating gate by an interpoly dielectric layer, the interpoly dielectric layer comprising a single layer adjacent to both the floating gate and the control gate, the single layer comprising a dielectric material, wherein the dielectric material is a metal silicate, a metal aluminate or a metal mixed-aluminate/silicate.

Thus, in the present invention, by use of a high-K dielectric material which replaces the nitride layer fully or partially, a modified ONO-type structure may be fabricated having reduced dimensions without degrading leakage current and electrical properties of the modified ONO structure and without sacrificing the charge trapping ability of the modified ONO structure in the two-bit EEPROM device. For the modified ONO structure in flash memory devices, the present invention provides advantages such as (1) reduction of equivalent oxide thickness of next generation devices; (2) composite high-K layers may provide improved charge trapping compared to nitride; (3) devices with high-K films for ONO structures are expected to have improved data retention and reliability; and (4) the high-K dielectric material layer allows fabrication of a modified ONO layer which is physically thicker, resulting in fewer charge leakage paths within the modified ONO structure. A variety of high-K dielectric materials may be used for a full or partial replacement of the nitride layer of an ONO structure, to obtain a modified ONO structure. The high-K dielectric materials may be formed in a nano-laminate structure, allowing for exact selection of composition, thickness and K value of the modified ONO structure. Thus, the present invention provides an advance in ONO fabrication technology, and ensures proper charge isolation in modified ONO structures used in MIRRORBIT™ two-bit EEPROM devices, ensures proper dielectric separation of the control gate electrode from the floating gate electrode in a floating gate flash device, and helps in scaling down the electrical thickness of ONO structures for next generation flash memory devices, while at the same time providing distinct process and economic advantages.

Although described herein in terms of MIRRORBIT™ two-bit EEPROM devices and floating gate flash devices, the present invention is broadly applicable to fabrication of any semiconductor device that includes an ONO structure.

Figure 1:
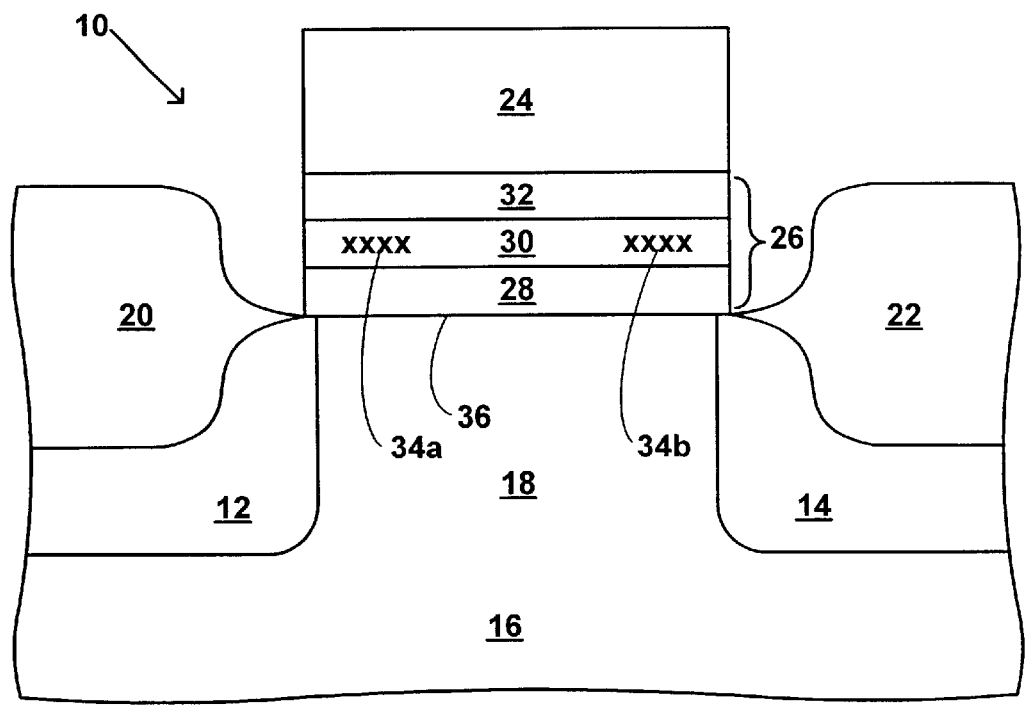
FIG. 1 schematically illustrates, in cross-section, a portion of a semiconductor substrate containing a two-bit EEPROM transistor which incorporates a modified ONO structure fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

MODES FOR CARRYING OUT THE INVENTION

Referring first to FIG. 1, there is schematically shown in cross-section a transistor 10 suitable for use in a two-bit EEPROM device, such as the MIRRORBIT™. The transistor 10 includes source/drain regions 12 and 14 located in a semiconductor substrate 16 and separated by a channel region 18. First and second bit line oxide regions 20 and 22 overlie source/drain regions 12 and 14, respectively. A gate electrode 24 overlies the channel region 18 and is separated therefrom by a modified ONO structure 26. The gate electrode 24 and the modified ONO structure 26 form a stacked-gate structure. The modified ONO structure 26 includes a first or tunnel silicon dioxide layer 28, a high-K dielectric material layer 30 and a top oxide layer 32, in that order as shown in FIG. 1.

Figure 2:
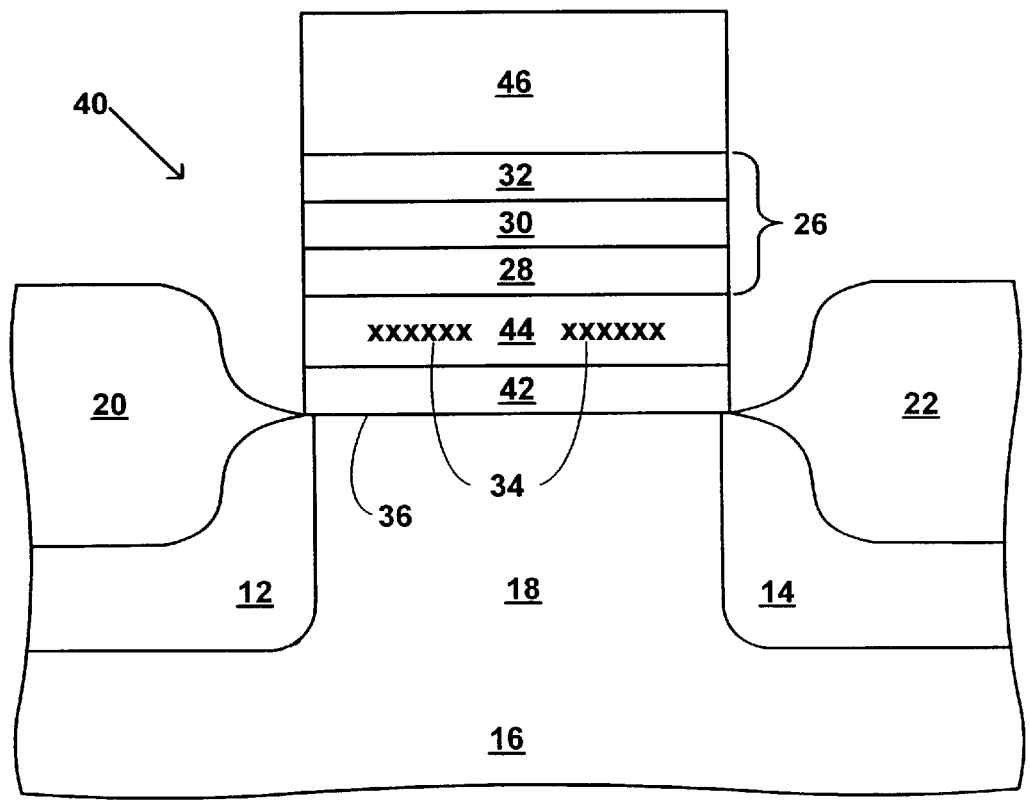
FIG. 2 schematically illustrates, in cross-section, a portion of a semiconductor device containing a floating gate flash transistor which incorporates a modified ONO structure fabricated in accordance with the invention.

Referring next to FIG. 2, there is schematically shown in cross-section a transistor 40 suitable for use in a floating gate flash EEPROM device. The transistor 40 includes source/drain regions 12 and 14 located in a semiconductor substrate 16 and separated by a channel region 18. First and second bit line oxide regions 20 and 22 overlie source/drain regions 12 and 14, respectively. A tunnel oxide layer 42 overlies the channel region 18. A floating gate electrode 44 overlies the tunnel oxide layer 42. The floating gate electrode 44 is separated from a control gate electrode 46 by a modified ONO structure interpoly dielectric layer 26. The control gate electrode 46, the modified ONO structure 26 and the floating gate electrode 44 form a floating gate flash memory structure. The modified ONO structure 26 in FIG. 2 is substantially the same as the modified ONO structure 26 shown in FIG. 1, except that in FIG. 1 the first oxide layer 28 may be referred to as a tunnel oxide layer 28, while in FIG. 2, the first oxide layer 28 may be referred to as a bottom oxide layer 28.

In general, in the modified ONO structure used in a floating gate device, the high-K material may replace the nitride layer fully or partially, while in a two-bit EEPROM device, such as the MIRRORBIT™, the high-K material typically only partially replaces the nitride of the ONO structure, since a small amount of nitride is typically needed for charge storage. In one embodiment, the small amount of nitride ranges from about 0.1 wt % to about 20 wt %, and in another embodiment, from about 1 wt % to about 10 wt %.

As used herein, the term "standard-K dielectric material" refers to a dielectric material having a K up to about 10. Such standard-K dielectric materials include, for example, silicon dioxide, which has a K of about 4, silicon oxynitride, which has a K of about 4–8 depending on the relative content of oxygen and nitrogen, and silicon nitride, which has a K of about 6–9, and aluminum oxide, which has a K of about 10.

As used herein, the term "mid-K dielectric material" refers to a dielectric material having a K in the range from greater than 10 to about 20. Such mid-K dielectric materials include, for example, composite materials such as hafnium silicate, which has a K of about 14, and hafnium silicon oxynitride, which has a K of about 16, depending on the relative content of oxygen and nitrogen, and hafnium silicon nitride, which has a K of about 18.

As used herein, the term "high-K dielectric material" refers to a dielectric material having a K of about 20 or more. Such high-K dielectric materials include, for example, $HfO_2$, $ZrO_2$ and others, some of which are identified more fully below. In general, the term "high-K dielectric material" encompasses binary, ternary and higher oxides and any ferroelectric material having a K of about 20 or more.

As used herein, the term "composite dielectric material" refers to a dielectric material comprising the elements of at least two other dielectric materials. A composite dielectric material may have a K value of a standard-K, mid-K or high-K dielectric material, depending on the elements combined to form the composite dielectric material. As described in more detail below, a composite dielectric material may be formed by co-deposition of its component elements, or by sequential deposition followed by a treatment step, e.g., thermal treatment, to combine the elements to form the composite dielectric material.

Regarding dielectric constants, or K values, silicon dioxide (sometimes simply referred to as "oxide") has a K value of about 4, while other dielectric materials have higher K values. Silicon nitride ("nitride"), for example, has a K of about 6 to 9 (depending on formation conditions). Much higher K values of, for example, 20 or more can be obtained with various transition metal oxides including hafnium oxide ($HfO_2$), zirconium oxide, ($ZrO_2$), tantalum oxide ($Ta_2O_5$), barium strontium titanate ("BST"), lead zirconate titanate ("PZT"), and others, some of which are described more fully below. Using a high-K dielectric material for full or partial replacement of the nitride layer to form a modified ONO structure would allow a low electrical thickness to be achieved even with a physically thick layer. For example, a layer of high-K dielectric material with a K of 20 and a thickness of 100 angstroms is substantially electrically equivalent to a layer of silicon dioxide (K about 4) having a thickness of about 20 angstroms. The electrically equivalent thickness of high-K materials may be referred to in terms of the equivalent oxide thickness. Thus, a layer of high-K dielectric material having a K of 20 and a given physical thickness has an equivalent oxide thickness (based on silicon dioxide) which is approximately ⅕ the given physical thickness. For even higher-K dielectric materials, even thicker gate dielectric layers can be formed while maintaining equivalent oxide thickness values lower than are possible with very thin silicon dioxide layers. In this way, the reliability problems associated with very thin dielectric layers may be avoided while transistor performance is increased. Thus, materials with high K values can be used for the ONO structure in flash memory devices for scaling down the electrical thickness of the ONO structure.

Approximate K-values or, in some cases, a range of K-values, are shown below in Table 1 for several exemplary dielectric materials. It is understood that the present invention is not limited to the specific dielectric materials disclosed herein, but may include any appropriate standard-K, mid-K, high-K and composite dielectric materials which are known and are compatible with the remaining elements of the semiconductor device with which the dielectric materials are to be used.

TABLE 1

| Dielectric Material | Approximate Dielectric Constant (K) (Relative Permittivity) |
| --- | --- |
| silicon dioxide | 3.9 |
| silicon nitride | 6–9 |
| silicon oxynitride | 4–8 |
| aluminum oxide | 10 |
| zirconium silicate | 12 |
| hafnium silicate | 15 |
| lanthanum oxide, $La_2O_3$ | 20–30 |
| hafnium oxide, $HfO_2$ | 40 |
| zirconium oxide, $ZrO_2$ | 25 |
| cerium oxide, $CeO_2$ | 26 |
| bismuth silicon oxide, $Bi_4Si_2O_{12}$ | 35–75 |
| titanium dioxide, $TiO_2$ | 30 |
| tantalum oxide, $Ta_2O_5$ | 26 |
| tungsten oxide, $WO_3$ | 42 |

TABLE 1-continued

| Dielectric Material | Approximate Dielectric Constant (K) (Relative Permittivity) |
|---|---|
| yttrium oxide, $Y_2O_3$ | 20 |
| $LaAlO_3$ | 25 |
| BST ($Ba_{1-x}Sr_xTiO_3$) | ~20—~200 |
| $PbTiO_3$ | ~20—~200 |
| $BaTiO_3$ | ~20—~200 |
| $SrTiO_3$ | ~20—~200 |
| $PbZrO_3$ | ~20—~200 |
| PST($PbSc_xTa_{1-xO3}$) | ~200—~3000 |
| PZN ($PbZn_xNb_{1-x}O_3$) | ~200—~5000 |
| PZT ($PbZr_xTi_{1-x}O_3$) | ~100—~1000 |
| PMN ($PbMg_xNb_{1-x}O_3$) | ~200—~5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

For MIRRORBIT™ and floating gate flash memory devices, the foregoing high-K dielectric materials can be used for replacing the nitride layer fully or partially. In MIRRORBIT™ devices, if the nitride layer is replaced partially by a high-K dielectric material the remaining nitride can still be used for charge storage. If the nitride layer is replaced fully by a high-K dielectric material, the high-K deposition process can be modified to incorporate a small amount of nitride into the high-K layer by either introducing NO or $N_2O$ gas during the deposition or by sequentially depositing high-K dielectric material sub-layers and nitride sub-layers. Thus, the high-K deposition process can be modified for forming a nitrided high-K layer which functions as a charge storage layer. The amount of nitrogen incorporated may range from about 0.1 wt % to about 20 wt % or more. If the nitride is formed by introducing NO or $N_2O$ gas during the deposition, the amount of nitride in the resulting nitride/high-K layer may be in a range from about 1 wt % to about 10 wt %. If the nitride is formed by sequentially depositing sub-layers of nitride and high-K dielectric material, the amount of nitride in the resulting nitride/high-K layer may be in a range from about 1 wt % to about 20 wt %. Although these ranges represent typical values, the amount of nitride in the nitride/high-K layer may be as high as desired, with the recognition that as the ratio of nitride to high-K material increases, the gains attributed to addition of the high-K material will be reduced. Similarly, the amount of nitride in the nitride/high-K layer may be reduced further as desired, with the recognition that reducing the amount of nitride to a too-low level may result in loss of charge storage ability of this layer on the modified ONO structure.

As used herein, when a material is referred to by a specific chemical name or formula, the material may include non-stoichiometric variations of the stoichiometrically exact formula identified by the chemical name. For example, hafnium oxide, when stoichiometrically exact, has the chemical formula $HfO_2$. As used herein, the term "hafnium oxide" may include variants of stoichiometric $HfO_2$, which may be referred to as $Hf_xO_y$, in which either of x or y vary by a small amount. For example, in one embodiment, x may vary from about 0.75 to about 1.5, and y may vary from about 1.5 to about 3. In another embodiment, x may vary from about 0.9 to about 1.2, and y may vary from about 1.8 to about 2.2. Such variations from the exact stoichiometric formula fall within the definition of hafnium oxide. Similar variations from exact stoichiometry are included when the chemical formula for a compound is used. For example, again using hafnium oxide as an example, when the formula $HfO_2$ is used, $Hf_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

The following description of the process of the present invention is described in the context of a modified ONO structure suitable for use in a two-bit EEPROM device, such as the MIRRORBIT™ device. It is to be understood that, while the present invention is discussed herein in that context, that this is merely exemplary and is not intended to limit the scope of the present invention. The modified ONO structure fabricated by the presently disclosed method is applicable to any semiconductor device in which an ONO structure may be included, and is particularly applicable also to the floating gate flash device described above with reference to FIG. 2.

The modified ONO structure 26 includes a first silicon dioxide layer 28 (tunnel oxide layer in a SONOS device or bottom oxide layer in the floating gate device) overlying the channel region 18. A layer 30 comprising a high-K dielectric material overlies the oxide layer 28. A second silicon dioxide layer (or top oxide layer) 32 overlies the high-K dielectric material-comprising layer 30.

In the operation of the exemplary two-bit EEPROM transistor 10 shown in FIG. 1, voltages are applied to the gate electrode 24 and to the source/drain regions 12 and 14. The applied voltages cause electrical charge from the source/drain regions 12 and 14 to propagate across the channel region 18. Once the charge encounters a sufficiently strong vertical field, the charge is either injected or tunnels from the channel region 18 into the high-K dielectric material-comprising layer 30. For example, depending upon the particular voltage levels applied to the control-gate electrode 24 and to the source/drain regions 12 and 14, electrical charges 34a, 34b are transferred into the high-K dielectric material layer 30 and are localized to regions in proximity to either the source/drain region 12, or the source/drain region 14. The electrical charges 34a and 34b each represent a single bit stored in the non-volatile memory cell.

Those skilled in the art will recognize that for proper functioning of a two-bit EEPROM device, the electrical charges 34a and 34b should remain isolated in the regions of the high-K dielectric material layer 30 to which each is initially introduced. The proper maintenance of the electrical charges 34a, 34b in localized regions of the high-K dielectric material layer 30 is needed for the proper performance of the two-bit EEPROM device. In particular, the quality of the modified ONO structure 26 should be such that charge leakage paths are minimized at the interface between the high-K dielectric material-comprising layer 30 and each of the tunnel oxide layer 28 and the top oxide layer 32. Additionally, the top oxide layer 32 should be of sufficient density that charge trapping sites are minimized within the silicon oxide material.

In operation of the floating gate flash device 40 shown in FIG. 2, electrons are transferred to the floating gate electrode 44 through the tunnel oxide 42 from the channel region 18 of the enhancement transistor. A voltage potential is applied to the floating gate electrode 44 by the overlying control gate electrode 46, which is capacitively coupled to the floating gate electrode 44 through the intervening modified ONO structure 26. The floating gate flash device 40 is programmed by applying a high positive voltage to the control gate electrode 46 and a lower positive voltage to the drain region 14, which transfers electrons from the channel region 18 to the floating gate electrode 44. The electrons are stored as a charge 34 in the floating gate electrode 44, as shown in FIG. 2.

It will be recognized that for proper operation of the floating gate flash device 40, the modified ONO structure interpoly dielectric layer 26 must provide effective dielectric separation between the control gate electrode 46 and the floating gate electrode 44. Any reduction in the electrical thickness of the layer 30 results in a reduction of the overall electrical thickness or the equivalent oxide thickness of the interpoly dielectric layer.

In accordance with the invention, charge leakage within the modified ONO structure 26 is minimized by forming a physically thick high-K layer 30 having a low equivalent oxide thickness. The reduced charge leakage and improved two-bit EEPROM performance obtained by the present invention can be better understood following a description of a fabrication process for the modified ONO structure carried out in accordance with the invention.

The following description of the present invention follows with reference to FIGS. 3–6. FIG. 7 is a schematic flow diagram showing the steps of the process of the present invention. The following description of the process refers to FIGS. 3–6 sequentially and with reference to FIG. 7 generally. The present invention can be carried out in a cluster tool.

In the first step of the present invention, shown schematically in FIG. 7 as Step S701, a semiconductor substrate is provided. The semiconductor substrate may be any appropriately selected semiconductor substrate known in the art. In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art. The present invention is not limited to any particular type of semiconductor substrate.

In a floating gate flash device, the semiconductor device provided in the first step of the method comprises not only a silicon substrate 16 but also a tunnel oxide layer 42 and a floating gate electrode 44 which have been formed on the silicon substrate 16. The tunnel oxide layer 42 and the floating gate electrode 46 may be formed appropriately by any process and from any material known in the art. In an embodiment in which the floating gate electrode 44 is formed of polysilicon, it has a silicon surface as described herein. Thus, the following description is applicable generally to a floating gate flash device, as well as to the two-bit EEPROM described above.

Figure 3:
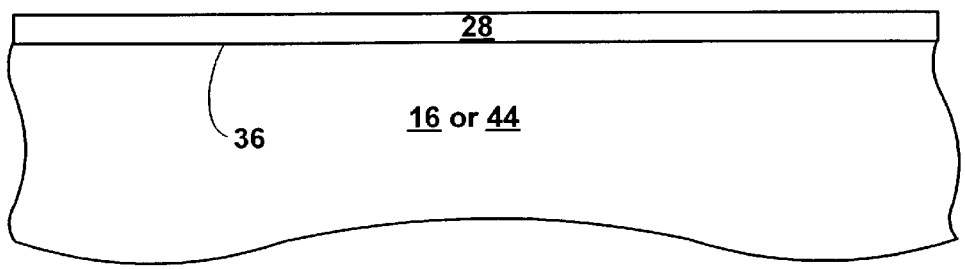
FIGS. 3–6 illustrate, in cross-section, process steps for the fabrication of a modified ONO structure and a gate structure thereover in accordance with the invention.

Referring to FIG. 3, in the second step of the present invention, shown schematically in FIG. 7 as Step S702, a first oxide layer 28 is formed on an upper silicon surface 36 of the semiconductor substrate 16. In one embodiment, the upper silicon surface is the upper surface of a polysilicon floating gate electrode. In one embodiment, the semiconductor substrate 16 is a single crystal silicon substrate. The substrate 16 may comprise other elements of a semiconductor device.

In one embodiment, the silicon surface 36 previously has been processed to remove contaminants and native oxide. A suitable pre-clean procedure includes cleaning the silicon surface 36 with a dilute solution of hydrofluoric acid or any standard cleaning procedure used in the semiconductor industry, including in-situ cleaning methods used in cluster tools.

As noted above, in an embodiment in which the semiconductor device includes a two-bit EEPROM device, the first oxide layer 28 may be referred to as the tunnel oxide layer 28, whereas in a floating gate flash device, the first oxide layer 28 may be referred to as a bottom oxide layer 28.

The first oxide layer 28 may be formed by either a growth (e.g., oxidation of the silicon surface) or a deposition process.

In one embodiment, the first oxide layer 28 is formed by a deposition process. In one embodiment, the first oxide layer 28 is formed by an RTCVD process. In one embodiment, the RTCVD deposition is carried out in the same RTCVD chamber as that in which the other steps of the present process are carried out. In one embodiment, the RTCVD chamber is part of a single-wafer cluster tool. The first oxide can also be formed by depositing the oxide in a batch furnace by an LPCVD process.

In one embodiment, the first oxide layer 28 is formed by rapid thermal oxidation (RTO) or by in-situ steam generation (ISSG) oxidation of the silicon surface 36 of the semiconductor substrate 16. The ISSG oxidation of the silicon surface 36 may be carried out, for example, in a rapid thermal process (RTP) apparatus. The RTP apparatus may be any such apparatus known in the art. In one embodiment, the RTP apparatus is part of a single-wafer cluster tool.

In one embodiment, the ISSG oxidation of the silicon surface 36 is carried out by placing the wafer in the RTP chamber and flowing a mixture of oxygen-containing gas and hydrogen-containing gas to the chamber at suitable flow rates and pressure. The temperature of the RTP chamber can be in the range from about 700° C. to about 150° C. The flow rates and temperature may be suitably selected to provide rapid oxidation of the silicon surface 36, to form an oxide layer of desired thickness.

For the ISSG process described above, any of the commercially available RTP systems can be utilized.

In one embodiment, the hydrogen-containing gas is hydrogen gas, $H_2$. In another embodiment, the hydrogen-containing gas is methane, $CH_4$. In one embodiment, methane is disfavored due to the possible incorporation of carbon into the silicon surface 36. In another embodiment, the hydrogen-containing gas may be ammonia, $NH_3$, but this may be disfavored since it may result in incorporation of nitrogen into the tunnel oxide being formed in the ISSG oxidation.

In one embodiment, the oxygen-containing gas is oxygen gas, $O_2$. In another embodiment, the oxygen-containing gas is hitrous oxide, $N_2O$.

When the hydrogen-containing gas is hydrogen and the oxygen containing gas is oxygen, in one embodiment, the ratio of hydrogen to oxygen is about 2:1, i.e., a substantially stoichiometric ratio. In one embodiment, an increased amount of oxygen is provided, in order to more rapidly drive the ISSG oxidation to completion. Thus, in one embodiment, the ratio of oxygen to hydrogen is in the range from greater than about 2:1 to about 5:1. In another embodiment, the ratio of oxygen to hydrogen is in the range from greater than about 2:1 to about 3:1.

In one embodiment, the absolute pressure in the RTP chamber is in the range from about 50 Torr to about 500 Torr. In another embodiment, the absolute pressure in the RTP chamber is in the range from about 100 Torr to about 300 Torr, and in another embodiment, from about 100 Torr to about 200 Torr, and in another, at about 150 Torr.

With the flows of oxygen-containing gas and hydrogen-containing gas provided to the chamber at a suitable flow rate and pressure and the silicon surface 36 at a temperature of about 500° C., additional heat is applied to the silicon surface 36 to bring it to a temperature in the range of about 700° C. to about 1150° C. In one embodiment, the temperature is in the range from about 900° C. to about 1100° C. When the surface reaches a suitable temperature, it provides an ignition source for reaction of the hydrogen-containing gas and oxygen-containing gas to form water steam, i.e., in-situ generated steam, or ISSG. In one embodiment, as a result of the use of tungsten halogen lights in a light pipe assembly, the ISSG reaction takes place substantially at the surface of the silicon surface 36, since only the surface of the wafer is substantially heated to the foregoing temperatures, as noted above. Formation of the in-situ generated steam at the silicon surface 36 allows greater control over the ISSG oxidation than is available with either other forms of steam oxidation or other oxidations, such as dry oxygen oxidation, or fluorine-enhanced oxidation.

The ISSG oxidation of the silicon surface 36 may continue for a period in the range from about 1 second to about 500 seconds. In one embodiment, the ISSG oxidation of the silicon surface 36 continues for a period from about 10 to about 120 seconds.

Following completion of the ISSG oxidation reaction, the gas flows of oxygen-containing gas and hydrogen-containing gas are stopped, the temperature of the wafer is reduced, and the chamber is purged with an inert gas, such as nitrogen or argon. In an embodiment in which the ISSG oxidation is carried out in an RTP apparatus which is part of a cluster tool, the wafer need not be fully cooled or removed from the chamber prior to subsequent processing steps.

In one embodiment, the ISSG oxidation is a single-step process. In one embodiment, the silicon surface 36 is directly oxidized under ISSG conditions in a single step, without employing an initial oxidation to form an initial oxide layer, followed by a second oxidation to complete the formation of the oxide layer.

In an alternate embodiment, the first oxide layer 28 may be formed by thermally oxidizing the silicon surface 36 at an elevated temperature in the presence of dry molecular oxygen. In one embodiment, the thermal oxidation is carried out at a temperature in the range of about 800° C. to about 1100° C. The thermal oxidation process may be carried out in either a batch-type thermal oxidation furnace, or alternatively, in a single-wafer oxidation apparatus. In one embodiment, the thermal oxidation is carried out in the same RTP apparatus as that in which the other steps of the present process are carried out. In one embodiment, the RTP chamber is part of a single-wafer cluster tool.

In one embodiment, the first oxide layer 28 has a thickness in the range from about 10 to about 150 angstroms (Å), and in another embodiment, the silicon oxide layer 28 has a thickness in the range from about 20 to about 100 Å.

Figure 4:
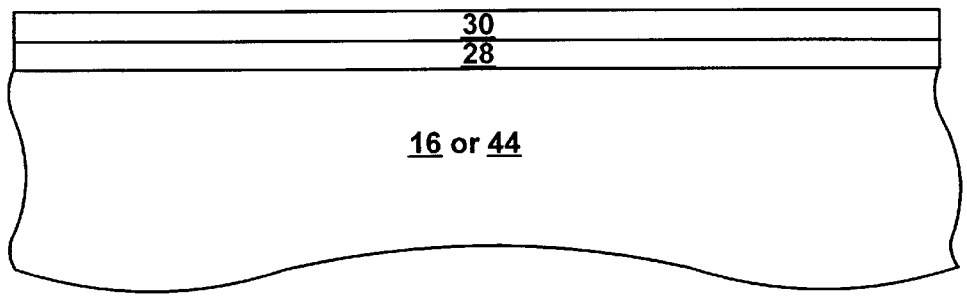

In the third step of the present invention, shown schematically in FIG. 7 as Step S703, a layer 30 comprising a high-K dielectric material is formed on the first oxide layer 28. As shown in FIG. 4, after forming the first oxide layer 28, the high-K dielectric material-comprising layer 30 is deposited on the first oxide layer 28. In one embodiment, the layer 30 comprises both a high-K dielectric material and a standard-K dielectric material. In one embodiment, the layer 30 comprises a composite dielectric material, which comprises a composite or a reaction product of two or more dielectric materials, at least one of which is a high-K dielectric material. In one embodiment, the composite dielectric material of which the layer 30 is formed is a mid-K dielectric material, which is a composite of a high-K dielectric material and a standard-K dielectric material. Thus, in one embodiment, the high-K dielectric material completely replaces the nitride layer of a conventional ONO structure. In another embodiment, the high-K dielectric material is, in essence, added to or combined with, the nitride layer of a conventional ONO structure. In another embodiment, the layer includes a composite dielectric material which replaces the nitride layer of a conventional ONO structure.

In another embodiment, the high-K dielectric material layer is sandwiched between two nitride layers, the lower of which is deposited on the first oxide layer 28. In another embodiment, a nitride layer is deposited on the first oxide layer 28 followed by deposition of a high-K dielectric material layer on the nitride layer. In another embodiment, the nitride layer is deposited on a high-K dielectric material layer which has been formed on the first oxide layer 28. In another embodiment, alternating sub-layers of nitride and high-K dielectric material are deposited on the first oxide layer 28.

In one embodiment, the high-K dielectric material-comprising layer 30 is formed by means of a rapid-thermal-chemical-vapor-deposition (RTCVD) process. In one embodiment, the RTCVD process is carried out at a temperature of about 400° C. to about 800° C. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the high-K dielectric material includes at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), silicon titanate ($SiTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate may be suitably used in the present invention. Other high-K dielectric materials known in the art, including, for example binary and ternary oxides having K values of about 20 or higher, also may be used in the present invention.

In one embodiment, the high-K material is a high-K material other than tantalum oxide ($Ta_2O_5$). Tantalum oxide has been found, in some embodiments, to exhibit an undesirably high leakage current. Tantalum oxide has been found, in some embodiments, to not provide the benefits of low leakage current, or to include other deleterious characteristics, such as poor thermal stability and undesirable reactions with silicon and polysilicon.

In one embodiment, the silicon nitride of an interpoly dielectric layer in a floating gate flash device is replaced with aluminum nitride. Aluminum nitride has a K value of about 9. As such it is within the range defined for standard-K dielectric materials. However, the K value for aluminum nitride is greater than the K value for silicon nitride, and as such may be used as the replacement material for the silicon nitride layer for the modified ONO structure of the present invention.

In one embodiment, the high-K dielectric material may be deposited by chemical vapor deposition (CVD). The CVD method may be any appropriate CVD method known in the art for deposition of a high-K material. For example, the CVD method may be ALD (ALCVD), PECVD, RTCVD, MOCVD or MLD.

Thus, for example, in an embodiment in which hafnium oxide is the high-K dielectric material, the hafnium may be supplied in the form of a hafnium-containing vapor or gas such as hafnium tetra-t-butoxide, and the oxygen is supplied in gaseous form as oxygen, $O_2$ or nitrous oxide, $N_2O$. When a suitable thickness of hafnium oxide has been deposited, the flow of the hafnium-containing vapor or gas and oxygen-containing gas are stopped.

As noted above, in an embodiment in which a plurality of high-K materials are deposited, alternating sub-layers of each high-K dielectric material may be deposited, or a composite dielectric material which comprises at least one high-K dielectric material may be deposited. Thus, a first high-K dielectric material precursor may be provided either simultaneously with or sequentially with a second dielectric precursor material. The second dielectric precursor material may be either a standard-K dielectric precursor or a high-K dielectric precursor. The process of alternating sub-layer deposition may be continued until a suitable number, selected number of sub-layers of desired composition and thickness has been deposited.

In one embodiment, a silicon containing gas, such as $SiH_4$, may be provided together with or alternating with the high-K precursor vapor, during the step of forming the high-K dielectric material sub-layers, in an embodiment in which a composite dielectric material comprising both a high-K dielectric material and a standard-K dielectric material is to be produced.

In one embodiment, a nitrogen-containing gas, such as ammonia ($NH_3$) may be provided along with the silicon-containing gas, oxygen-containing gas and high-K precursor.

In one embodiment, the process is carried out for a period of time and at gas flow rates sufficient to form a high-K dielectric material-comprising layer 30 having a thickness of about 25 Å to about 300 Å. In another embodiment, the process is carried out for a period of time and at gas flow rates sufficient to form a high-K dielectric material-comprising layer having a thickness of about 50 Å to about 200 Å, and in another embodiment, the process is carried out for a period of time and at gas flow rates sufficient to form a high-K dielectric material-comprising layer having a thickness of about 50 Å to about 100 Å.

In one embodiment, high-K dielectric material precursor is introduced in the CVD apparatus at a flow rate of about 1 standard liter per minute (slpm) and either oxygen or nitrous oxide is introduced at a flow rate of about 1 slpm. Suitable flow rates of any other gases or vapors provided to the CVD apparatus may be determined by those of skill in the art, based on the composition of the layer 30 which is desired.

In one embodiment, the CVD is ALCVD, atomic layer chemical vapor deposition. ALCVD may be used to deposit a dielectric material in layers as thin as a molecular monolayer. Formation of such monolayers allows formation of a nano-laminate structure of any selected dielectric materials. The nano-laminate structure provides for deposition of a plurality of different high-K dielectric materials as sub-layers or nano-layers. The sub-layers may be deposited with single dielectric materials or with a plurality of simultaneously formed dielectric materials. The nano-laminates may thus form a composite high-K dielectric material layer. Alternatively, sequentially deposited, different dielectric materials may be annealed subsequently to form a composite dielectric material which comprises the elements of the sequentially deposited, different dielectric materials. The conditions of deposition may be suitably selected to provide a nano-laminate or composite high-K dielectric material layer having a controlled physical thickness, composition and K value.

Thus, for example, ALCVD or MOCVD may be used in combination with RTCVD to deposit alternating monolayers of hafnium oxide and silicon nitride (respectively), in a partial replacement of the ONO nitride with a high-K dielectric material. The alternating layers may be retained, or the structure may be annealed to cause reaction or combination of the elements to form a composite dielectric material which would include the elements Hf/Si/O/N. Depending on the relative amounts of hafnium oxide and silicon nitride deposited, the composite dielectric material may have a formula such as $HfSi_3O_2N_4$. Of course, it will be recognized that while the composite material includes the elements of the individual dielectric materials deposited, the exact stoichiometry may vary widely from this example.

As another example, a plurality of high-K dielectric materials may be deposited to replace the N of the ONO structure in forming the modified ONO structure, either simultaneously or in sequentially deposited sub-layers of selected thickness. A combination of high-K dielectric materials may be selected in order to obtain a desired characteristic such as charge retention, K value, physical thickness, equivalent oxide thickness, or a selected combination of these or other features. The use of ALCVD, with its capability of depositing a molecular monolayer of selected dielectric materials provides a wide range of possible structures for the modified ONO structure.

In an embodiment in which the CVD is a RTCVD, the RTCVD process is carried out in three steps including an initial temperature ramp, a deposition step, and cool-down step. In one embodiment, the total reaction time is about 1–3 minutes. In another embodiment, the silicon nitride deposition step is completed in about 2 minutes.

In another embodiment, the high-K dielectric material layer 30 may be formed by means of a low-pressure-chemical-vapor-deposition (LPCVD) process. In this alternative embodiment, the high-K dielectric material can be formed in a batch deposition apparatus. In one embodiment, the LPCVD process is carried out at an absolute pressure of about 200 to about 500 millitorr (mtorr), at temperatures of about 400° C. to about 800° C. using a high-K dielectric material precursor and either oxygen or nitrous oxide.

Suitable high-K precursor materials are known in the art. For example, for hafnium oxide, hafnium tetra-t-butoxide has been mentioned above. For zirconium oxide, a suitable precursor is zirconium tetra-t-butoxide.

Figure 5:
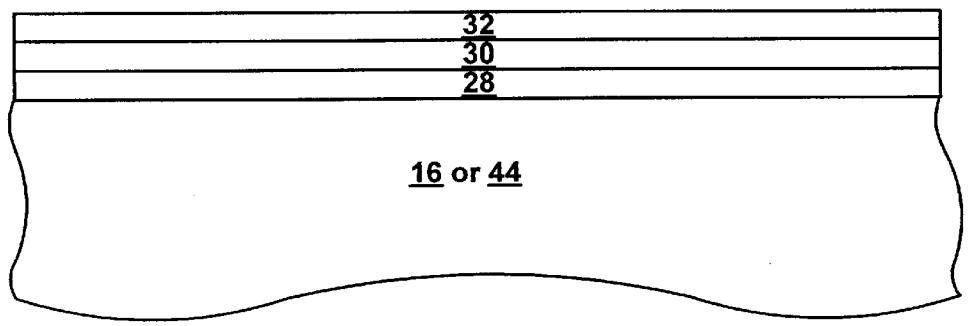

In the fourth step of the present invention, shown schematically in FIG. 7 as Step S704, a top oxide layer 32 is formed on the high-K dielectric material layer 30 by RTCVD or LPCVD of a second silicon oxide layer on the upper surface of the high-K dielectric material layer 30. As shown in FIG. 5, after depositing the high-K dielectric material-comprising layer 30, the second silicon oxide layer 32, also referred to as a top oxide layer, is formed on the high-K dielectric material-comprising layer 30. In accordance with the invention, the top oxide layer 32 may be formed by any appropriate method known in the art.

In one embodiment, an important feature of the invention includes the sequential formation of the high-K dielectric material layer 30 and the top oxide layer 32 (the top oxide) in the absence of exposure of the high-K dielectric material layer 30 to ambient atmosphere. Following the deposition of the high-K dielectric material layer 30 onto the first oxide layer 28, the top oxide layer 32 is formed by RTCVD in a single wafer cluster tool, without the necessity of being transferred to a separate oxide deposition chamber, which would entail either maintenance of vacuum conditions without exposing the substrate to ambient atmosphere, or application of a positive-pressure inert gas atmosphere during wafer transfer. Thus, the present invention provides distinct process and economic advantages in formation of a modified ONO structure.

Figure 6:
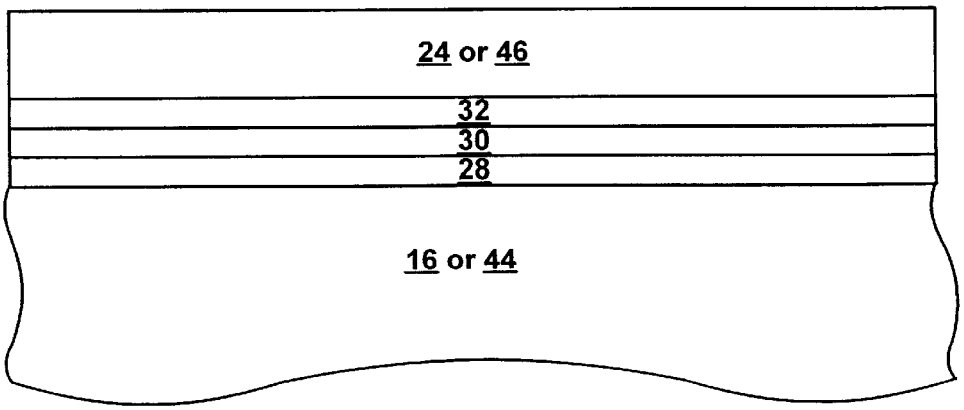
Figure 7:
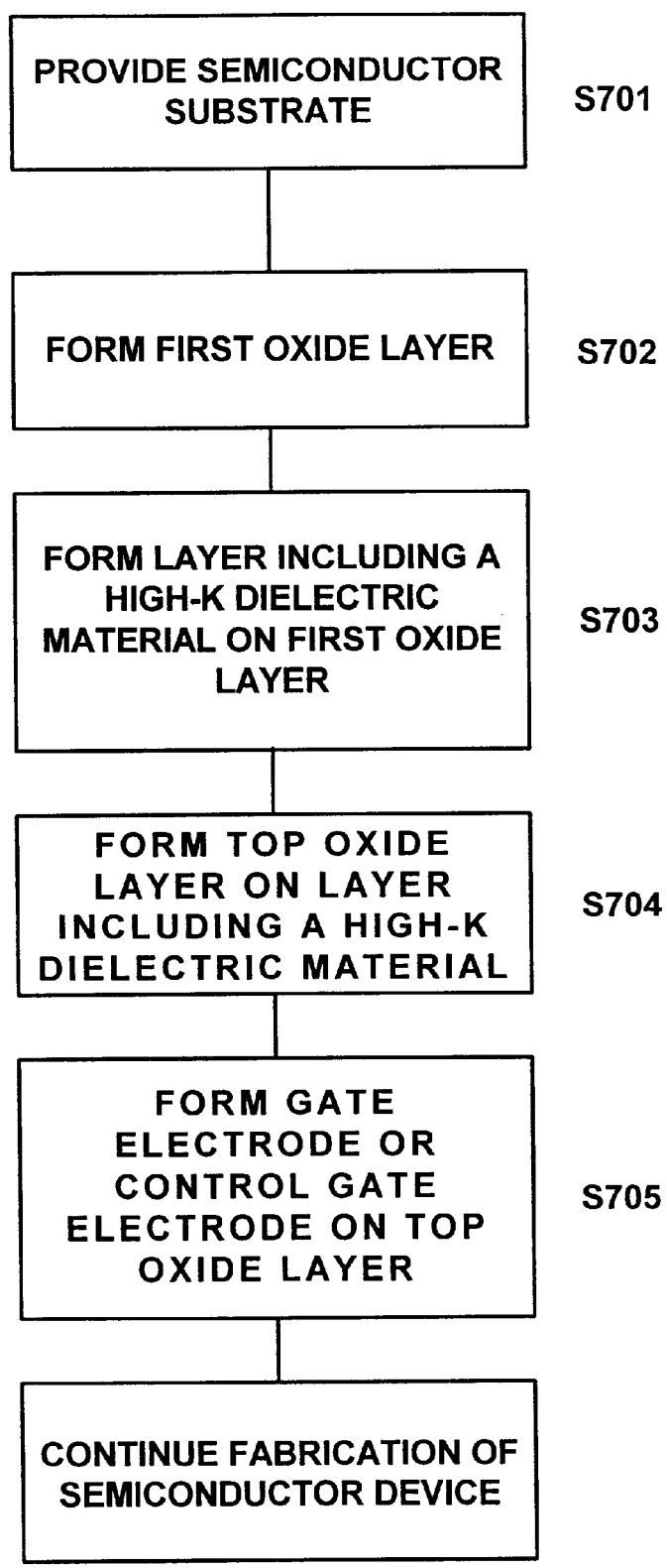
FIG. 7 is a schematic flow diagram showing the steps of the present invention.

As shown in FIG. 6, following formation of the modified ONO structure 26 in accordance with the present invention, shown schematically in FIG. 7 as Step S705, a layer forming a gate electrode 24, in the case of the two-bit EEPROM, is formed on the top oxide layer 32. In the case of the floating gate flash device, a control gate electrode 46 is formed on the top oxide layer 32. The stacked-gate structures shown in FIGS. 1 and 2 are completed by depositing a layer of gate forming material overlying the top oxide layer 32. A lithographic patterning and etching process may then be carried out to define the gate electrode 24 (or control gate electrode 46) and the modified ONO structure 26. Those skilled in the art will recognize that various gate-forming materials can be used to fabricate the gate electrode 24. For example, the gate electrode 24 and the control gate electrode 46 can be formed with polycrystalline silicon, amorphous silicon, a refractory metal silicide, a metal, and the like.

Following formation of the gate electrode 24, or the control gate electrode 46, as appropriate, and the modified ONO structure 26, fabrication of the semiconductor device continues, as indicated in the final step of FIG. 7.

For example, fabrication of the semiconductor device may include annealing the device in order to densify the silicon dioxide and/or high-K dielectric material layers and/or to further form the composite dielectric material of the layer 30.

Figure 8:
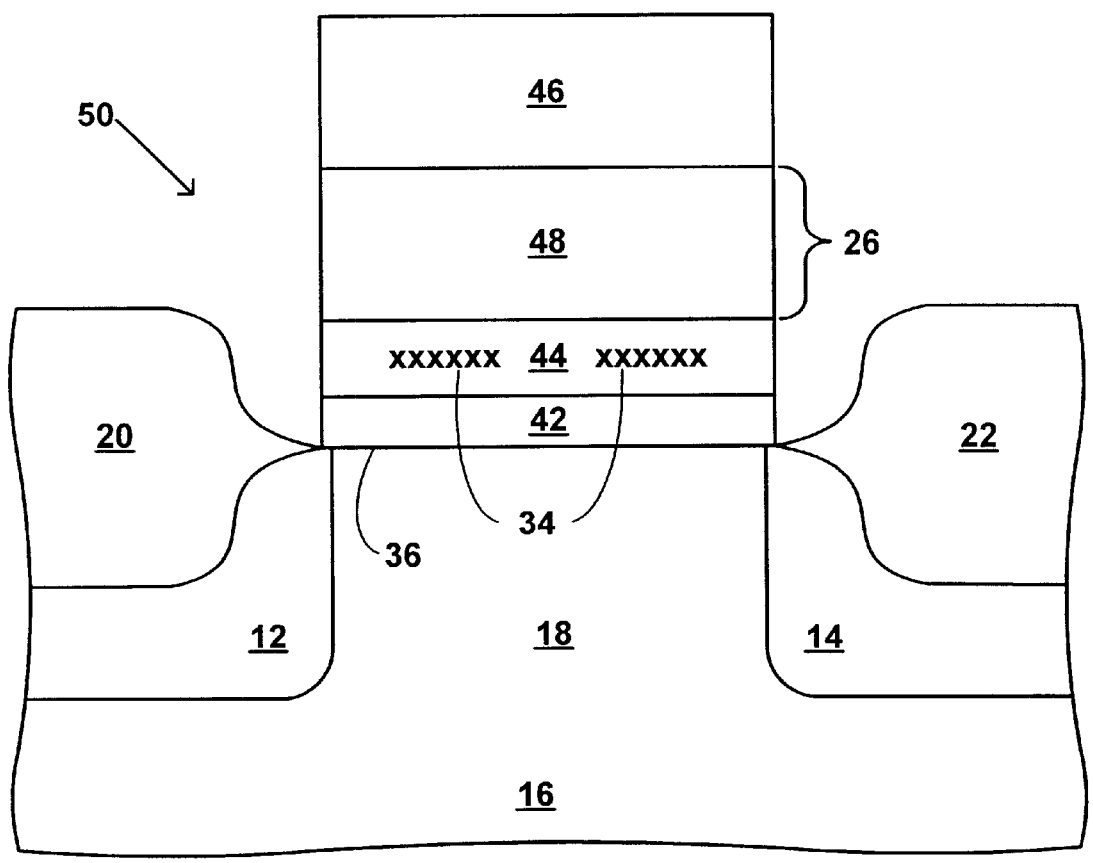
FIG. 8 schematically illustrates, in cross-section, another embodiment of the present invention, including a composite dielectric material layer.

FIG. 8 shows an embodiment of the present invention in which the semiconductor device has been annealed to form a composite dielectric material of the combined layers 28, 30 and 32. In this embodiment, a non-volatile memory cell 50 (here a floating gate memory cell) is formed which includes a) a substrate 16 including a source region 12, a drain region 14, and a channel region 18 positioned therebetween; b) a floating gate 44 positioned above the channel region 18 and separated from the channel region 18 by a tunnel dielectric film 42; and c) a control gate 46 positioned above the floating gate 44 and separated from the floating gate 44 by an interpoly dielectric layer 26. In this embodiment, the interpoly dielectric layer 26 includes a single layer 48 adjacent to both the floating gate 42 and the control gate 46. In this embodiment, the single layer 48 is a dielectric material which is a metal silicate, a metal aluminate or a metal mixed-aluminate/silicate. Thus, for example, using hafnium as the exemplary metal, the dielectric material forming the layer 48 may be hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$.

Suitable metals for the metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metals which, when combined with silicon dioxide or aluminum oxide, or a mixture thereof, yield a material having a K value greater than about 10 may be suitable. The metal silicate, metal aluminate or metal mixed-aluminate/silicate substantially should not react with silicon (or polysilicon) at temperatures up to about 600–800° C.

There has been disclosed in accordance with the invention a process for fabricating an ONO floating-gate electrode in both a MIRRORBIT™ two-bit EEPROM device and a floating gate flash device, both of which provide the advantages set forth above (as appropriate). As noted above, the process of the invention is also applicable to other semiconductor devices which include an ONO structure.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the modified ONO structure can be varied from that described herein. It is therefore intended to include within the invention all such variations and modifications that fall within the scope of the appended claims and equivalents thereof.

INDUSTRIAL APPLICABILITY

Thus, in accordance with the present invention, a semiconductor device including a modified ONO structure is provided with improved properties. The present invention can be carried out in a cluster tool. The present invention provides advantages such as (1) formation of a cleaner interface between layers of the modified ONO structure, resulting in fewer interface states that could provide charge leakage paths; (2) use of a high-K dielectric material, which allows formation of a physically thicker interpoly dielectric layer or charge storage layer having a lower equivalent oxide thickness; (3) a process for scaling down the electrical thickness of ONO structures for flash memory devices; and (4) an efficient process which may be carried out in a single device, such as a cluster tool. Thus, the present invention provides an advance in interpoly dielectric fabrication technology, ensures proper dielectric separation of the control gate electrode from the floating gate electrode in floating gate flash devices and ensures proper charge storage and isolation in modified ONO structures used in MIRRORBIT™ two-bit EEPROM devices, while at the same time providing distinct process and economic advantages. The present invention helps in scaling down the electrical thickness of ONO structures for both MIRRORBIT™ two-bit EEPROM and floating gate flash memory devices. Although described in terms of, and particularly applicable to, two-bit EEPROM devices, the present invention is broadly applicable to fabrication of any semiconductor device including a modified ONO structure.

What is claimed is:

1. A semiconductor device comprising a modified ONO structure, wherein the modified ONO structure comprises
   a bottom oxide layer;
   a layer comprising a composite dielectric material on the bottom oxide layer, wherein the composite dielectric material comprises elements of at least one high-K dielectric material; and
   a top oxide layer on the layer comprising a composite dielectric material.

2. The semiconductor device of claim 1, wherein the high-K dielectric material comprises at least one of hafnium oxide ($HfO_2$), zirconium oxide ($ZrO_2$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

3. The semiconductor device of claim 1, wherein the modified ONO structure is a memory cell in a SONOS type cell modified to incorporate the composite dielectric material in the nitride layer of the ONO structure.

4. The semiconductor device of claim 1, wherein the modified ONO structure is a memory cell in a two-bit EEPROM modified to incorporate the composite dielectric material in the nitride layer of the ONO structure.

5. A non-volatile memory cell comprising:
   a) a substrate comprising a source region, a drain region, and a channel region positioned therebetween;
   b) a floating gate positioned above the channel region and separated from the channel region by a tunnel dielectric film; and
   c) a control gate positioned above the floating gate and separated from the floating gate by an interpoly dielectric layer, the interpoly dielectric layer comprising a bottom silicon dioxide layer adjacent to the floating gate, a top silicon dioxide layer adjacent to the control gate, and a center layer comprising a high-K dielectric material and positioned between the bottom silicon dioxide layer and the top silicon dioxide layer, with the proviso that when the center layer comprises tantalum oxide ($Ta_2O_3$), the center layer further comprises at least one additional dielectric material.

6. The non-volatile memory cell of claim 5, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

7. The non-volatile memory cell of claim 5, wherein the center layer comprises a composite dielectric material including elements of the high-K dielectric material and at least one additional dielectric material.

8. The non-volatile memory cell of claim 7, wherein the at least one additional dielectric material comprises aluminum nitride.

9. A non-volatile memory cell comprising:
   a) a substrate comprising a source region, a drain region, and a channel region positioned therebetween;
   b) a charge storage layer comprising a modified ONO structure, having a bottom silicon dioxide layer adjacent the channel region, a top silicon dioxide layer, and a center charge storage layer comprising a high-K dielectric material and positioned between the bottom silicon oxide layer and the top silicon dioxide layer; and
   c) a gate capacitively coupled to the channel region through the charge storage layer.

10. The non-volatile memory cell of claim 9, wherein the high-K dielectric material comprises at least one of hafnium oxide ($HfO_2$), zirconium oxide ($ZrO_2$), tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$).

11. The non-volatile memory cell of claim 9, wherein the charge storage layer comprises a composite dielectric material including elements of the high-K dielectric material and at least one additional dielectric material.

12. The non-volatile memory cell of claim 9, wherein the memory cell is a SONOS type cell modified to incorporate the high-K dielectric material in the center charge storage layer.

13. The non-volatile memory cell of claim 9, wherein the memory cell is a two-bit EEPROM cell modified to incorporate the high-K dielectric material in the center charge storage layer.

14. A non-volatile memory cell comprising:
   a) a substrate comprising a source region, a drain region, and a channel region positioned therebetween;
   b) a floating gate positioned above the channel region and separated from the channel region by a tunnel dielectric film; and
   c) a control gate positioned above the floating gate and separated from the floating gate by an interpoly dielectric layer, the interpoly dielectric layer comprising a single layer adjacent to both the floating gate and the control gate, the single layer comprising a dielectric material, wherein the dielectric material is a metal silicate, a metal aluminate or a metal mixed-aluminate-silicate.

15. The non-volatile memory cell of claim 14, wherein the dielectric material is a metal silicate and the metal is hafnium, zirconium, yttrium, cerium, tantalum, titanium, lanthanum, tungsten, bismuth, barium, strontium, scandium, niobium or lead, or mixtures thereof.

16. The non-volatile memory cell of claim 14, wherein the dielectric material is a metal aluminate or a metal mixed-aluminate-silicate and the metal is hafnium, zirconium, yttrium, cerium, tantalum, titanium, lanthanum, tungsten, bismuth, barium, strontium, scandium, niobium or lead, or mixtures thereof.

* * * * *